(12) United States Patent
Huemoeller et al.

(10) Patent No.: US 9,799,592 B2
(45) Date of Patent: Oct. 24, 2017

(54) SEMICONDUTOR DEVICE WITH THROUGH-SILICON VIA-LESS DEEP WELLS

(71) Applicant: Amkor Technology, Inc., Chandler, AZ (US)

(72) Inventors: Ronald Patrick Huemoeller, Gilbert, AZ (US); Michael G. Kelly, San Tan Valley, AZ (US); David Jon Hiner, Chandler, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 14/083,779

(22) Filed: Nov. 19, 2013

(65) Prior Publication Data

US 2015/0137384 A1    May 21, 2015

(51) Int. Cl.
*H01L 21/44* (2006.01)
*H01L 21/50* (2006.01)
(Continued)

(52) U.S. Cl.
CPC ...... *H01L 23/49838* (2013.01); *H01L 21/486* (2013.01); *H01L 21/4853* (2013.01); *H01L 21/6835* (2013.01); *H01L 23/3121* (2013.01); *H01L 23/49811* (2013.01); *H01L 23/49816* (2013.01); *H01L 23/49822* (2013.01); *H01L 23/49827* (2013.01); *H01L 25/071* (2013.01); *H01L 2221/6834* (2013.01); *H01L 2221/68327* (2013.01); *H01L 2221/68345* (2013.01); *H01L 2221/68377* (2013.01); *H01L 2221/68381* (2013.01); *H01L 2224/16227* (2013.01); *H01L 2224/16235* (2013.01); *H01L 2224/32225* (2013.01); *H01L 2224/73204* (2013.01); *H01L 2224/81005* (2013.01); *H01L 2224/83005* (2013.01); *H01L 2224/92125* (2013.01);
(Continued)

(58) Field of Classification Search
CPC ........... H01L 23/5384; H01L 21/76895; H01L 23/3135
USPC ......... 257/693, 712; 438/106, 113, 122, 612
See application file for complete search history.

(56) References Cited

U.S. PATENT DOCUMENTS

2007/0064395 A1* 3/2007 Chen et al. .................... 361/699
2008/0175939 A1* 7/2008 Danovitch et al. ......... 425/174.4
2008/0197491 A1* 8/2008 Matsui .................... H01L 23/60
                                                                 257/737
(Continued)

*Primary Examiner* — Kimberly Rizkallah
*Assistant Examiner* — Brian Turner
(74) *Attorney, Agent, or Firm* — McAndrews, Held & Malloy, Ltd.

(57) ABSTRACT

Methods and systems for a semiconductor device with through-silicon via-less deep wells are disclosed and may include forming a mask pattern on a silicon carrier, etching wells in the silicon carrier, and forming metal contacts in the etched wells, wherein the metal contacts comprise a plurality of deposited metal layers. Redistribution layers may be formed on a subset of the contacts and a dielectric layer may be formed on the silicon carrier and formed redistribution layers. Vias may be formed through the dielectric layer to a second subset of the contacts and second redistribution layers may be formed on the dielectric layer. A semiconductor die may be electrically coupled to the second formed redistribution layers and formed vias. The semiconductor die and top surface of the dielectric layer may be encapsulated and the silicon carrier may be thinned to a thickness of the contacts or may be completely removed.

18 Claims, 7 Drawing Sheets

(51) Int. Cl.
*H01L 21/768* (2006.01)
*H01L 23/498* (2006.01)
*H01L 23/50* (2006.01)
*H01L 21/48* (2006.01)
*H01L 21/683* (2006.01)
*H01L 23/31* (2006.01)
*H01L 25/07* (2006.01)

(52) U.S. Cl.
CPC .......... *H01L 2924/0002* (2013.01); *H01L 2924/1531* (2013.01); *H01L 2924/15192* (2013.01); *H01L 2924/18161* (2013.01); *H01L 2924/19041* (2013.01); *H01L 2924/19042* (2013.01); *H01L 2924/19043* (2013.01); *H01L 2924/19105* (2013.01)

(56) References Cited

U.S. PATENT DOCUMENTS

| | | | |
|---|---|---|---|
| 2008/0283959 A1* | 11/2008 | Chen | H01L 21/76898 257/508 |
| 2008/0290496 A1* | 11/2008 | Park | 257/693 |
| 2010/0130000 A1* | 5/2010 | Sutou et al. | 438/612 |
| 2010/0308443 A1* | 12/2010 | Suthiwongsunthorn | H01L 21/486 257/621 |
| 2011/0186992 A1* | 8/2011 | Wu | H01L 21/486 257/737 |
| 2011/0254156 A1* | 10/2011 | Lin | 257/737 |
| 2012/0091578 A1* | 4/2012 | Chen | H01L 24/03 257/737 |

\* cited by examiner

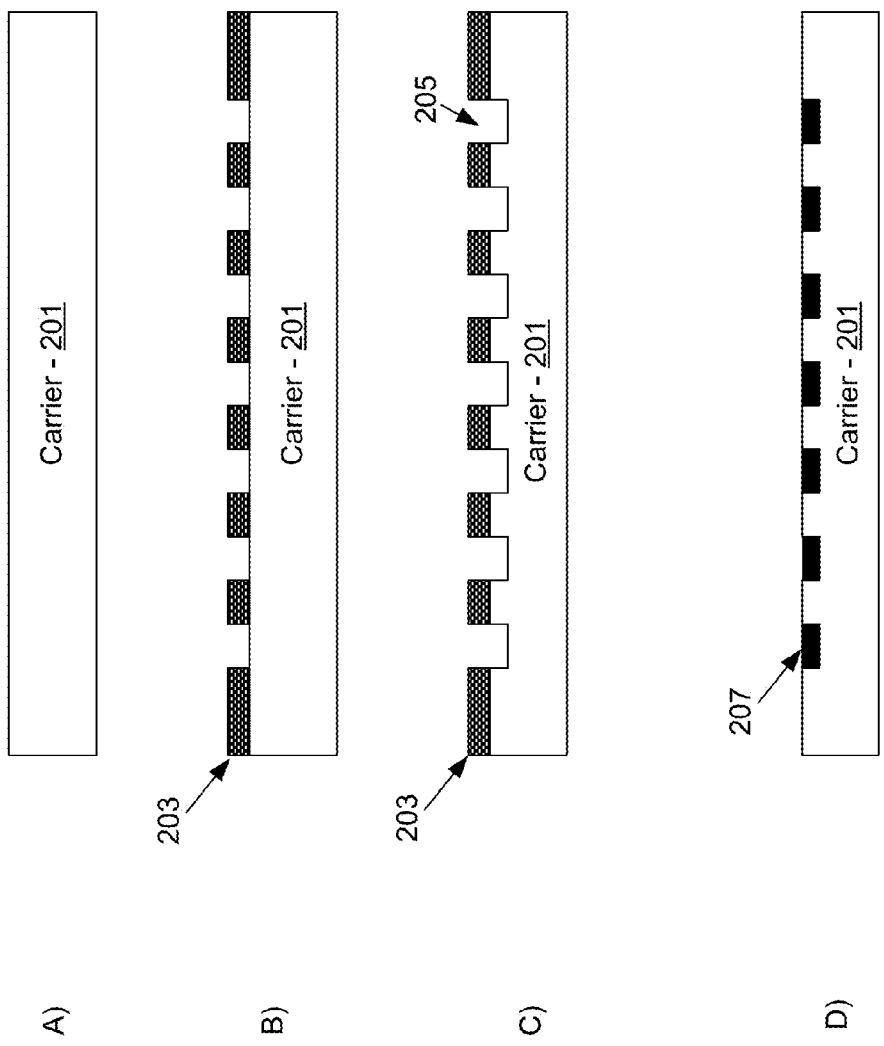

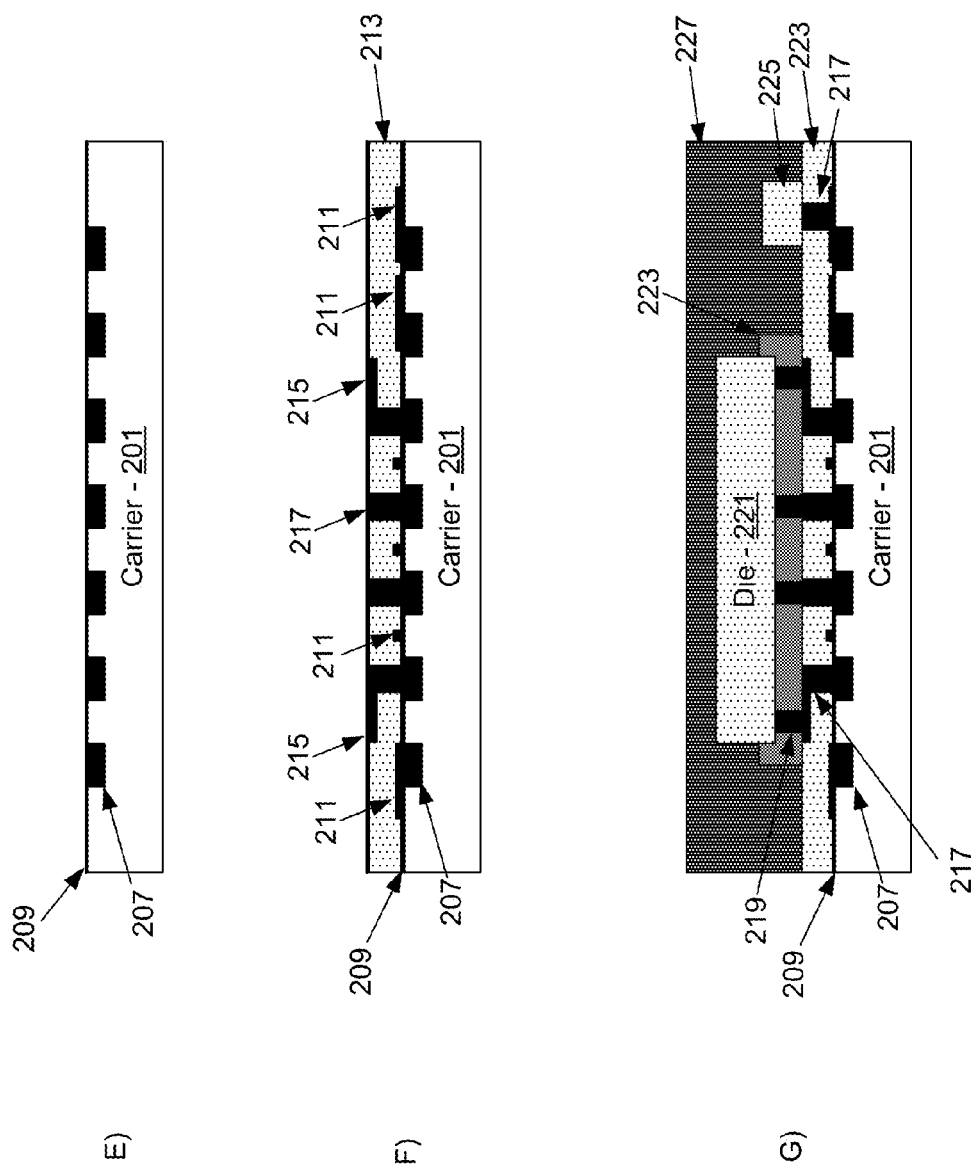

SEMICONDUTOR DEVICE WITH THROUGH-SILICON VIA-LESS DEEP WELLS

FIELD

Certain embodiments of the disclosure relate to semiconductor chip packaging. More specifically, certain embodiments of the disclosure relate to a semiconductor device with through-silicon via-less deep wells.

BACKGROUND

Semiconductor packaging protects integrated circuits, or chips, from physical damage and external stresses. In addition, it can provide a thermal conductance path to efficiently remove heat generated in a chip, and also provide electrical connections to other components such as printed circuit boards, for example. Materials used for semiconductor packaging typically comprises ceramic or plastic, and form-factors have progressed from ceramic flat packs and dual in-line packages to pin grid arrays and leadless chip carrier packages, among others.

Further limitations and disadvantages of conventional and traditional approaches will become apparent to one of skill in the art, through comparison of such systems with the present disclosure as set forth in the remainder of the present application with reference to the drawings.

BRIEF DESCRIPTION OF SEVERAL VIEWS OF THE DRAWINGS

FIGS. 2A-2I illustrate a process for forming pre-fabricated embedded pads utilizing through-silicon via-less deep wells, in accordance with an example embodiment of the disclosure.

DETAILED DESCRIPTION

Certain aspects of the disclosure may be found in a semiconductor device with through-silicon via-less deep wells. Example aspects of the disclosure may comprise forming a mask pattern on a silicon carrier, forming wells in the silicon carrier, and forming metal contacts in the formed wells, wherein the metal contacts comprise a plurality of deposited metal layers. Redistribution layers may be formed on a subset of the formed metal contacts and a dielectric layer may be formed on the silicon carrier and formed redistribution layers. Vias may be formed through the dielectric layer to a second subset of the formed metal contacts and second redistribution layers may be formed on the dielectric layer. A semiconductor die may be electrically coupled to the second formed redistribution layers and formed vias. The semiconductor die and top surface of the dielectric layer may be encapsulated by an encapsulant and the silicon carrier may be thinned to a thickness that exposes the metal contacts formed in the formed wells. The silicon carrier may be completely removed. The metal contacts may comprise copper posts or solder balls. A barrier metal may be formed on the formed metal contacts and top surface of the silicon carrier. Sloped sidewalls may be formed when forming the wells by etching the silicon carrier. Solder formed in the wells with sloped sidewalls may be reflowed. A barrier metal may be formed on the reflowed solder and a top surface of the silicon carrier. An underfill material may be formed between the semiconductor die and the second formed redistribution layers and formed vias. A discrete device may be electrically coupled to a via formed in the dielectric layer.

Figures 1A, 1B, 1C, 1D:
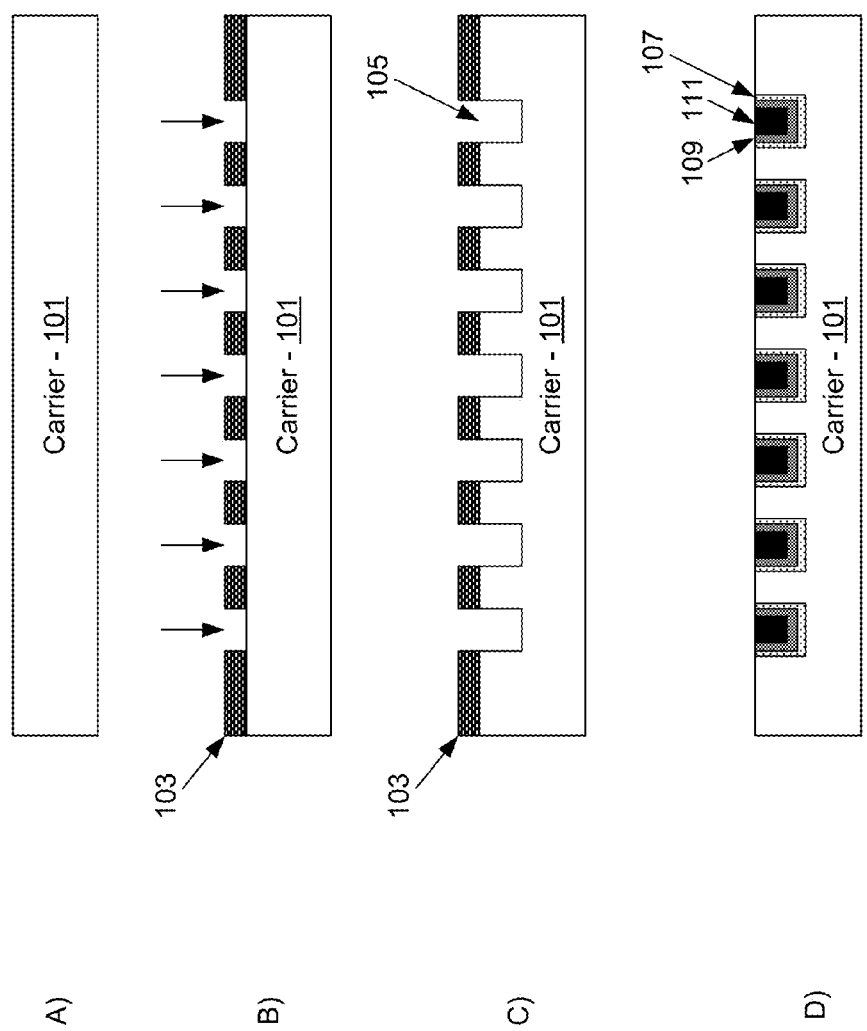
FIGS. 1A-1I illustrate a process for forming pre-fabricated ball grid arrays or copper posts utilizing through-silicon via-less deep wells, in accordance with an example embodiment of the disclosure.

FIGS. 1A-1I illustrate a process for forming pre-fabricated ball grid arrays or copper posts utilizing through-silicon via-less deep wells, in accordance with an example embodiment of the disclosure. Referring to FIG. 1A, there is shown a carrier 101, which may comprise a silicon substrate, for example. A silicon substrate utilized as a carrier may provide rigidity during processing while also being capable of being part of the finished package.

A mask pattern 103 may be formed on the carrier 101, and may comprise metal or a photoresist material, for example. The regions of the carrier 101 that are exposed by the mask pattern 103 may be etched, laser ablated, or milled to form deep wells 105, as shown in FIGS. 1B and 1C. Photolithography techniques may, for example, be utilized to form the mask pattern 103.

The deep wells 105 may be utilized to form pre-fabricated ball-grid arrays or coppers posts for subsequent bonding of the structure to a substrate or circuit board, as opposed to forming the metal contacts after processing the entire structure. Forming the contacts last may decrease yields and increase costs as the entire structure including any bonded semiconductor die could be scrapped when forming the contacts on the thinned structure.

The mask pattern 103 may also be used to fill the wells 105 with metal paste, for example. Following the metal deposition, the mask pattern 103 may be removed. In an alternative scenario, the wells 105 may be plated with different metals to be formed into a metal contact. For example, the wells 105 may be plated with tin/lead, tin/silver, copper, or other suitable contact metal combinations. In an example scenario, metal layer 107, 109, and 111 may comprise tin/silver (or other solder alloy), a nickel barrier, and copper, respectively. Copper may be used for rigid standoffs for creating taller posts, for example.

In an example scenario, the wells 105 may be filled with metal layers 107, 109, and 111, which may comprise tin/lead, tin/silver, and copper, for example. The top surface of the carrier and metal layers 107, 109, and 111 may be polished and a barrier metal 113 may be deposited on the polished surface, as shown in FIG. 1E, to resist a subsequent silicon etch of the carrier 101, if needed.

Redistribution layers may be formed by depositing or plating copper, or other suitable metal, and one or more dielectric layers on the carrier 101 and metal layers 107, 109, and 111. For example, the redistribution layers 115 may be formed on the barrier metal 113, followed by the deposition of the dielectric layer 117, which may comprise a silicon dioxide or nitride material, for example. In another example scenario, the dielectric layer 117 may comprise a polymer material.

Figures 1E, 1F, 1G:
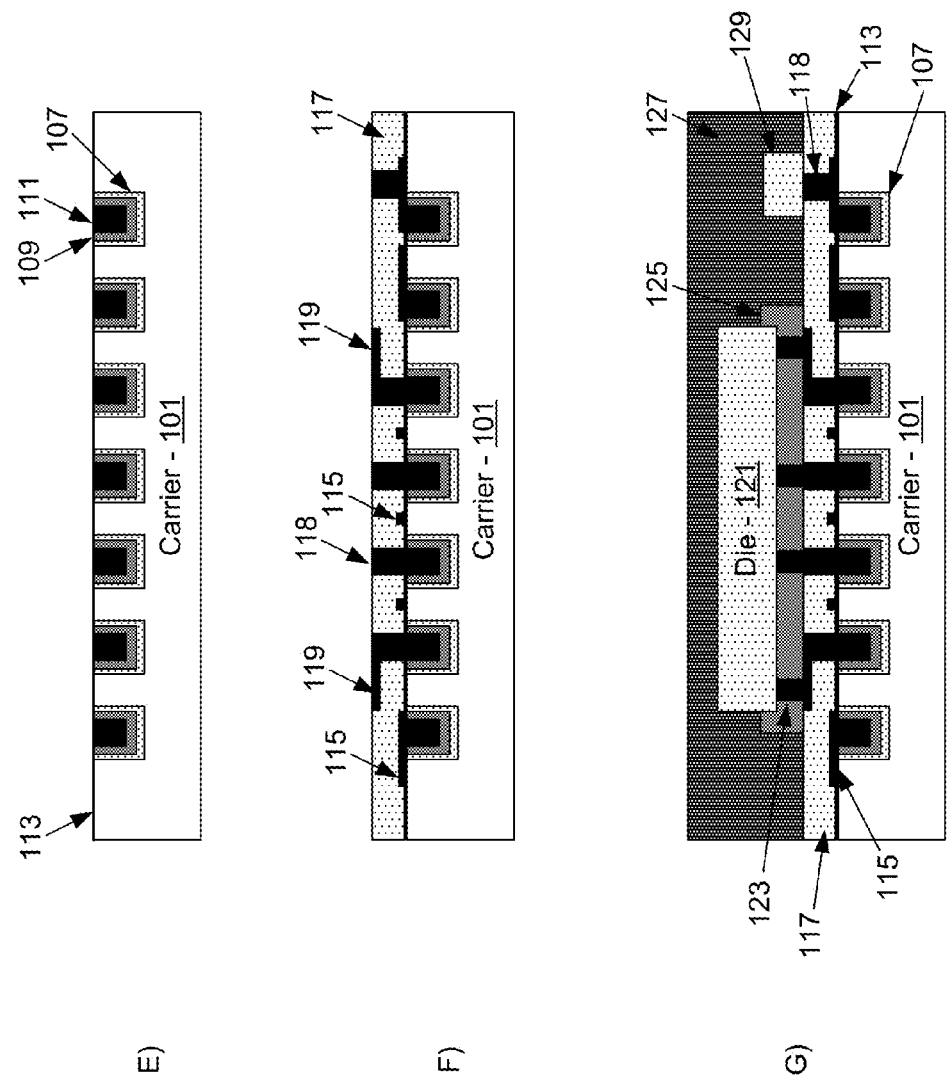

The dielectric layer 117 may be etched or ablated to form vias and grooves for forming the vias 118 and the redistribution layers 119, with the resulting structure shown in FIG. 1F. A semiconductor die 121 may then be bonded to the redistribution layers 119 and vias 118, for example utilizing the conductive bumps 123. The semiconductor die 121 may comprise electrical circuitry such as digital signal processor(s), network processor(s), power management unit(s), audio processor(s), RF circuitry, wireless baseband system-on-chip (SoC) processor(s), sensor(s), memory, and application specific integrated circuit(s), for example. An underfill material 125 may be utilized, for example, to fill the void between the semiconductor die 121 and the dielectric layer 117.

In an example scenario, a discrete device 129 may be bonded to a via 118. The discrete device may comprise an inductor or capacitor, for example, that may be difficult or impractical to be integrated in the semiconductor die 121. While one die and one discrete device are shown, the disclosure is not so limited. Accordingly, any number of die or devices may be bonded to the structure. The redistribution layers 116 and 119 and the vias 118 may provide electrical interconnection between devices coupled to the metal layers 107, 109, and 111 and the die 121. An encapsulant material 127 may then be deposited by compression molding, for example, thereby encapsulating the die 121, the discrete device 129, and the top surface of the dielectric layer 117, as shown in FIG. 1G.

Figures 1H, 1I:
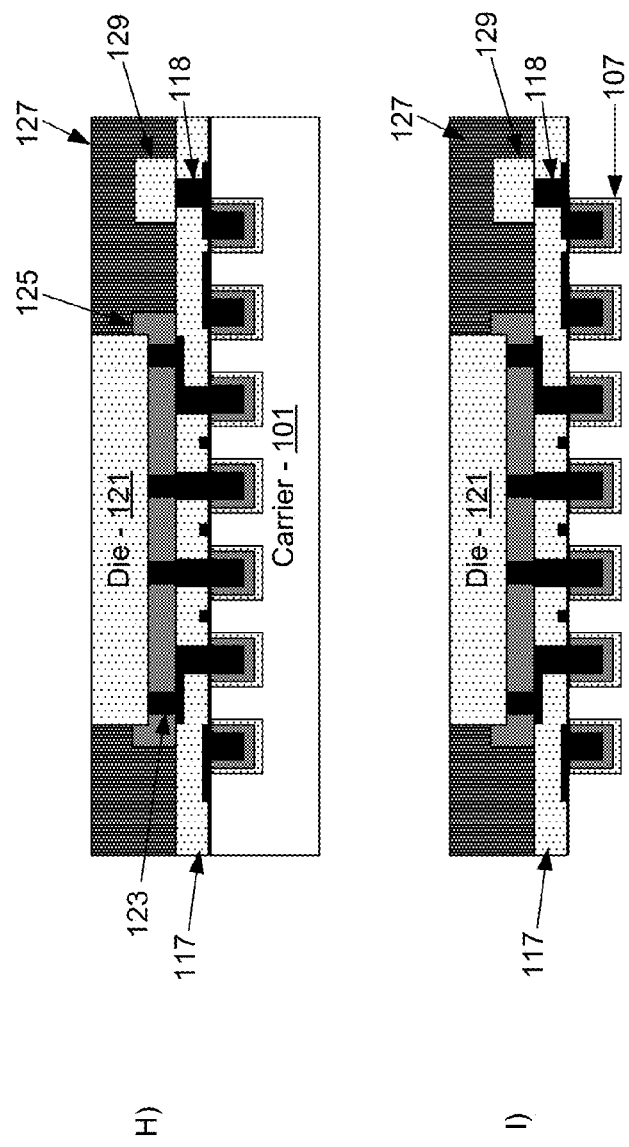

The encapsulant material 127 may comprise a polymer epoxy material, for example, that may provide physical protection for the semiconductor die 121, the discrete device 129, and the dielectric layer 117, and provide structural strength for the package. The encapsulant material 127 may be ground down to expose the top surface of the die 121, as shown in FIG. 1H. The top surface of the die 121 may be exposed to provide a thermal path for heat dissipation, for example, by subsequent placement of a heat sink.

In an alternative scenario, a pre-punched material 127 may be placed around the die 121 and on the surface of the dielectric layer 117 as opposed to compression molded encapsulant material. Subsequent heating may cause the pre-punched material to flow into unfilled volume, similar to compression molded encapsulant.

The carrier 101 may then be thinned or removed utilizing a polishing and/or etching process, for example, resulting in the structure shown in FIG. 1I. An example process may comprise a back grind to thin the carrier 101 to near the metal layers 107, 109, and 111, and then a chemical etch to remove the remaining silicon, if desired. In an alternative scenario, some of the silicon may remain to act as reinforcement and warpage control, and also as a protective barrier to low-k dielectrics. Furthermore, the barrier metal 113 may be removed, for example, by etching or ablating. The now exposed metal layers 107, 109, and 111 may be utilized to bond the structure to a substrate or circuit board, for example.

By incorporating the pre-fabricated metal contacts comprising the metal layers 107, 109, and 111, a need for plating solder bumps or copper pillar bumps after wafer thinning, i.e., after thinning the carrier 101, is eliminated, thereby increasing yields and lowering costs. This may also eliminate the need for a wafer support system.

Figures 2H, 2I:
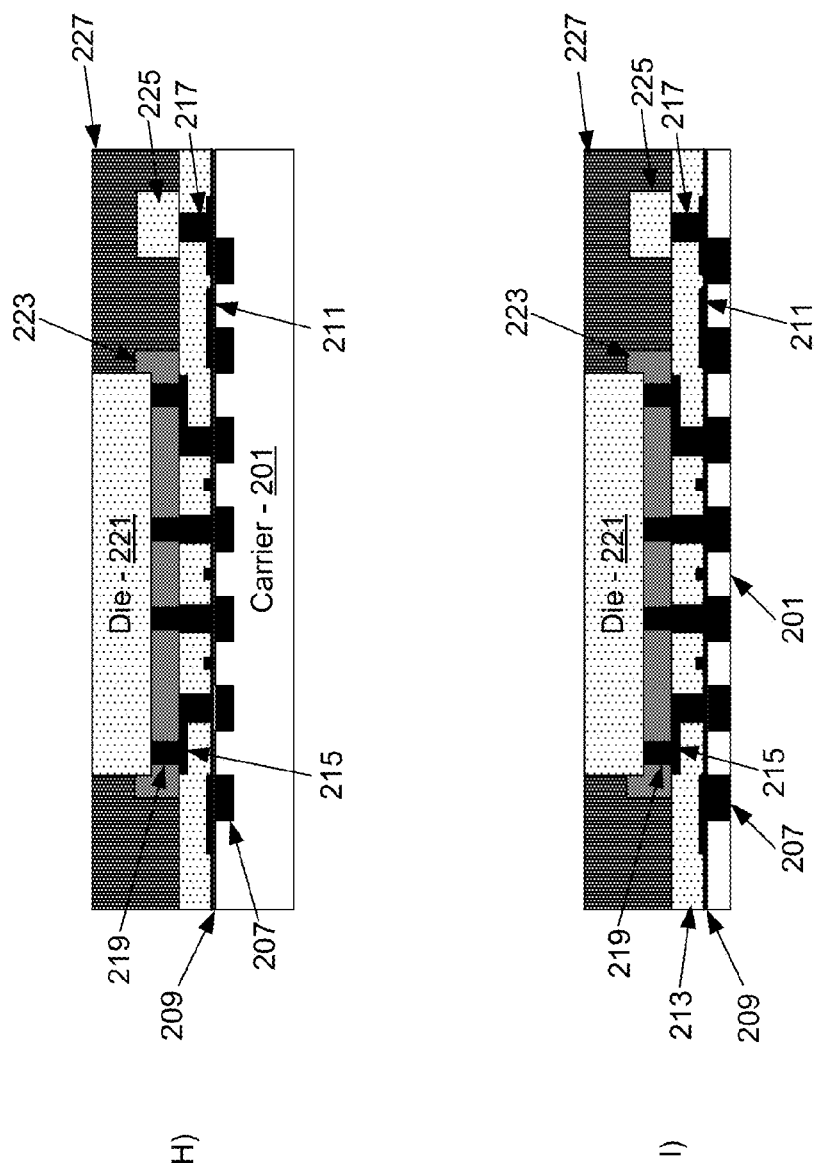

FIGS. 2A-2I illustrate a process for forming pre-fabricated embedded pads utilizing through-silicon via-less deep wells, in accordance with an example embodiment of the disclosure. Referring to FIG. 2A, there is shown a carrier 101, which may comprise a silicon substrate, for example. Referring to FIG. 2B, a mask pattern 203 may be formed on the carrier 201, and may comprise metal or a photoresist material, for example. The regions of the carrier 201 that are exposed by the mask pattern 203 may be etched or milled to form wells 205, as shown in FIG. 2C.

The wells 205 may be utilized to form pre-fabricated embedded pads for subsequent bonding to a substrate or circuit board. The mask pattern 203 may also be used to fill the wells 205 with metal such as through a metal plating process, for example, thereby forming the metal pads 207, as shown in FIG. 2D. Following the metal deposition, the mask pattern 203 may be removed. In an alternative scenario, the wells 205 may be plated with different metals to be formed into a metal contact. For example, the wells 205 may be plated with tin/lead, tin/silver, copper, or other suitable metal pad combinations.

The top surface of the carrier and metal pads 207 may be polished and a barrier metal 209 may be deposited on the polished surface, as shown in FIG. 2E, to resist a subsequent silicon etch of the carrier 201, if needed.

Redistribution layers 211 may be formed by depositing or plating copper, or other suitable metal, and one or more dielectric layers 213 on the carrier 201 and metal pads 207. For example the redistribution layers 211 may be formed on the barrier metal 209, followed by the deposition of the dielectric layer 213, which may comprise a silicon dioxide or nitride material, for example. In another example scenario, the dielectric layer 213 may comprise a polymer material.

The dielectric layer 213 may be etched or ablated to form vias and grooves for forming the vias 217 and the redistribution layers 215, with the resulting structure shown in FIG. 2F. The etched or ablated regions may be filled via copper plating or other suitable metal deposition technique, thereby forming electrical interconnections through and across the top surface of dielectric layer 213.

A semiconductor die 221 may then be bonded to the redistribution layers 215 and vias 217, for example utilizing the conductive bumps 219. The semiconductor die 221 may comprise electrical circuitry such as digital signal processors (DSPs), network processors, power management units, audio processors, RF circuitry, wireless baseband system-on-chip (SoC) processors, sensors, memory, and application specific integrated circuits, for example. An underfill material 223 may be utilized, for example, to fill the void between the semiconductor die 221 and the dielectric layer 223.

In an example scenario, a discrete device 225 may be bonded to a via 217 in the dielectric layer 223. The discrete device may comprise an inductor or capacitor, for example, that may be difficult or impractical to be integrated in the semiconductor die 121. While one die and one discrete device are shown in FIG. 2G, the disclosure is not so limited. Accordingly any number of die or devices may be bonded to the structure. The redistribution layers 211 and 215 and the vias 217 may provide electrical interconnection between devices coupled to the metal layers metal pads 207 and the die 221.

An encapsulant material 227 may then be deposited by compression molding, for example, encapsulating the die 221, the discrete device 225, and the top surface of the dielectric layer 223, as shown in FIG. 2G. The encapsulant material 227 may comprise a polymer epoxy material, for example, that may provide physical protection for the semiconductor die 221, the discrete device 225, and the dielectric layer 223 and provide structural strength for the package. The encapsulant material 227 may be ground down to expose the top surface of the die 221, as shown in FIG. 2H. The top surface of the die 221 may be exposed to provide a thermal path for heat dissipation, for example, by subsequent placement of a heat sink.

In an alternative scenario, a pre-punched material 227 may be placed around the die 221 and on the surface of the dielectric layer 217 in place of the compression molded encapsulant. Subsequent heating may cause the pre-punched material to flow into unfilled volume similar to an encapsulant process.

The carrier 201 may then be thinned down to the thickness of the metal pads 207 utilizing a polishing and/or etching process, for example, resulting in the structure shown in FIG. 2I. An example process may comprise a back grind to thin the carrier 201 to near the metal pads 207, and then a chemical etch to thin down to the thickness of the metal pads 207. The remaining silicon of the carrier 201 may remain to act as reinforcement and warpage control, and also as a protective barrier to low-k dielectrics. Because the carrier 201 may comprise silicon, a semiconductor, as opposed to a metal carrier, a portion of the carrier may remain without shorting out the metal pads 207.

In an alternative scenario, the carrier 201 may be completely removed followed by the barrier metal 209 being removed, for example by etching or ablating. The metal pads 207 may be utilized to bond the structure to a substrate or circuit board, for example.

Figures 3A, 3B, 3C, 3D:
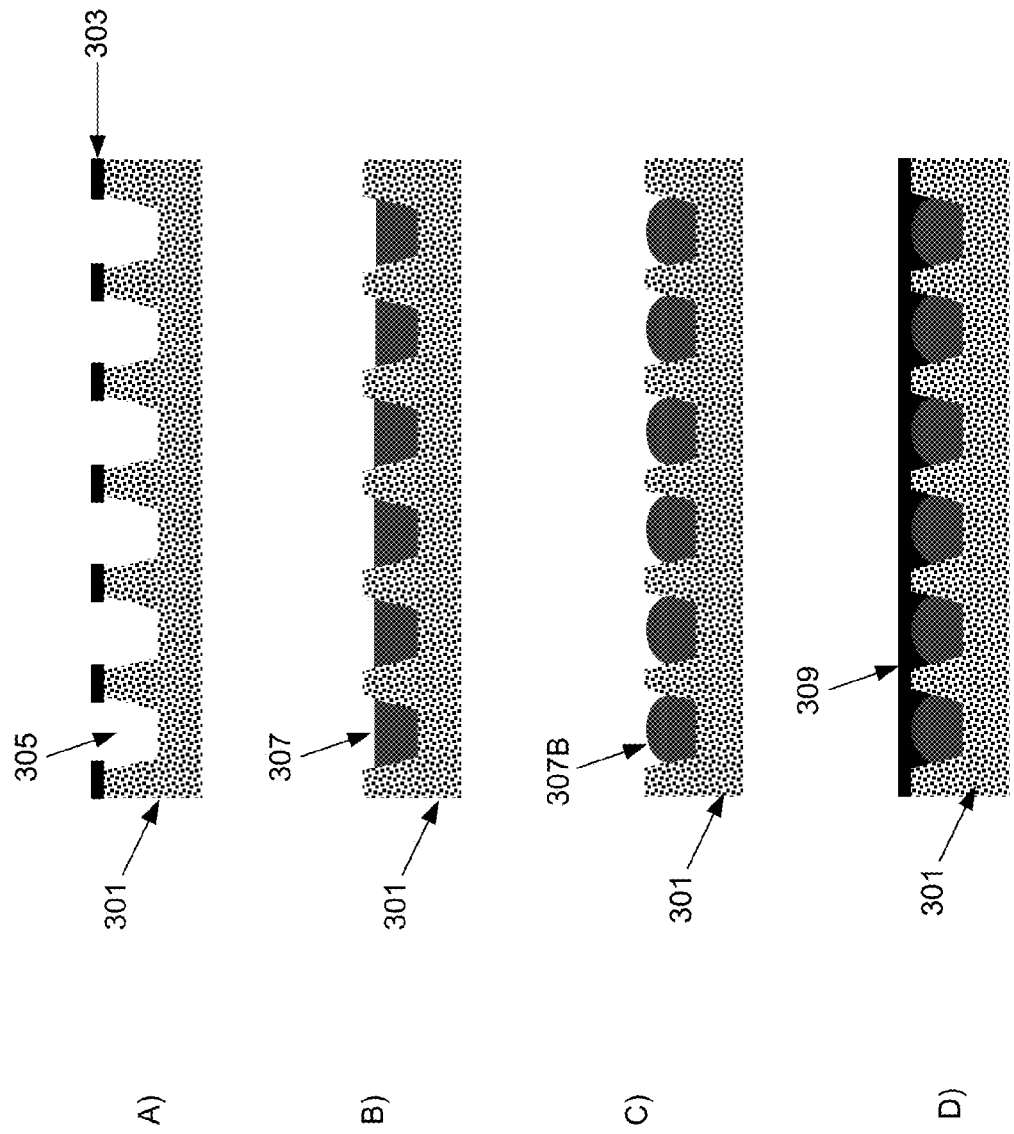
FIGS. 3A-3D illustrate solder well etching, in accordance with an example embodiment of the disclosure.

FIGS. 3A-3D illustrate solder well etching, in accordance with an example embodiment of the disclosure. Referring to FIG. 3A, there is shown a silicon carrier 301 with mask 303. The mask 303 may protect the carrier where no etching is to occur and expose regions to be etched, such that the solder wells 305 result from an etching process on the silicon carrier 301. Depending on the crystallographic orientation of the silicon carrier 301 and the chemical etchant or etching process used, the slope of the sidewalls may vary.

An etching process may provide some undercut of the mask pattern, depending on the etching process and crystal orientation, as shown by the overhang in the mask 303 over the formed solder wells 305.

Sloped sidewalls may be advantageous for metal plating or filling the wells with metal pastes. Therefore, a metal plating process or a metal paste may be applied to the etched solder wells 305, resulting in the solder 307 shown in FIG. 3B. The mask layer 303 may remain during the metal deposition or filling, followed by a mask strip process.

The solder 307 may then be reflowed to reduce or eliminate air pockets or voids and to remove volatile materials. The reflow process may result in a curved top surface as shown by the reflowed solder 307B in FIG. 3C. Finally, a barrier metal 309 may be plated on the top surface of the carrier 301 and the reflowed solder 307B, which may prevent the migration of tin or tin by-products. The resulting structure shown in FIG. 3D may then proceed in the processes described with respect to FIGS. 1 and 2, being inserted at FIG. 1E or 2E.

In an embodiment of the disclosure, a device is disclosed for a semiconductor device with through-silicon via-less deep wells. In this regard, aspects of the disclosure may comprise forming a mask pattern on a silicon carrier, forming wells in the silicon carrier, and forming metal contacts in the formed wells, wherein the metal contacts comprise a plurality of deposited metal layers. The wells may be formed by etching or laser ablation, for example. Redistribution layers may be formed on a subset of the formed metal contacts and a dielectric layer may be formed on the silicon carrier and formed redistribution layers.

Vias may be formed through the dielectric layer to a second subset of the formed metal contacts and second redistribution layers may be formed on the dielectric layer. A semiconductor die may be electrically coupled to the second formed redistribution layers and formed vias. The semiconductor die and top surface of the dielectric layer may be encapsulated by an encapsulant and the silicon carrier may be thinned to a thickness that exposes the metal contacts formed in the etched wells. The silicon carrier may be completely removed. The metal contacts may comprise copper posts or solder balls.

A barrier metal may be formed on the formed metal contacts and top surface of the silicon carrier. Sloped sidewalls may be formed when etching the wells in the silicon carrier. Solder formed in the wells with sloped sidewalls may be reflowed. A barrier metal may be formed on the reflowed solder and a top surface of the silicon carrier. An underfill material may be formed between the semiconductor die and the second formed redistribution layers and formed vias. A discrete device may be electrically coupled to a via formed in the dielectric layer.

While the disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A method for semiconductor packaging, the method comprising:
   providing a silicon carrier comprising:
     wells at a first surface of the silicon carrier; and
     conductive interconnection structures within the wells;
   forming a signal distribution structure on the silicon carrier, the signal distribution structure comprising:
     a conductive layer comprising traces that are electrically connected to the conductive interconnection structures;
     a dielectric layer on the conductive layer; and
     vias through the dielectric layer to the traces of the conductive layer;
   electrically coupling a semiconductor die to the traces of the conductive layer;
   encapsulating at least lateral sides of the semiconductor die and a top surface of the signal distribution structure in an encapsulating material; and
   thinning the silicon carrier to expose a first end surface of the conductive interconnection structures and to expose at least a portion of a second surface of the conductive interconnection structures.

2. The method according to claim 1, wherein said thinning the silicon carrier comprises thinning the silicon carrier until all silicon of the silicon carrier has been removed.

3. The method according to claim 1, wherein the provided silicon carrier comprises a barrier metal directly on the conductive interconnection structures.

4. The method according to claim 1, wherein the conductive interconnection structures in the wells comprise solder within the wells.

5. The method according to claim 1, wherein the exposed at least a portion of the second surfaces of the conductive interconnection structures comprises a sloped sidewall.

6. The method according to claim 1, wherein the provided silicon carrier comprises a barrier metal on the conductive interconnection structures and on the first surface of the silicon carrier, the method further comprising removing at least a portion of the barrier metal.

7. The method according to claim 1, wherein the conductive interconnection structures within the wells of the provided silicon carrier directly contact silicon of the provided silicon carrier.

8. The method according to claim 1, comprising thinning the encapsulating material to expose the semiconductor die.

9. The method according to claim 1, wherein the provided silicon carrier includes no electronic devices.

10. A method for semiconductor packaging, the method comprising:
   providing a silicon carrier having no electronic devices and comprising:
      wells at a first surface of the silicon carrier;
      conductive interconnection structures within the wells;
      a signal distribution structure comprising:
         a conductive layer comprising traces that are electrically connected to the conductive interconnection structures;
         a dielectric layer on the conductive layer; and
         vias through the dielectric layer to the traces of the conductive layer;
   electrically coupling a semiconductor die to the traces of the conductive layer;
   thinning the silicon carrier to expose at least a first surface of the conductive interconnection structures; and
   encapsulating at least lateral sides of the semiconductor die and a top surface of the signal distribution structure in an encapsulating material.

11. The method according to claim 10, wherein said thinning the silicon carrier comprises thinning the silicon carrier to expose at least a portion of a second surface of the conductive interconnection structures.

12. The method according to claim 11, wherein said thinning the silicon carrier comprises thinning the silicon carrier until all silicon of the silicon carrier has been removed.

13. The method according to claim 11, wherein the exposed at least a portion of the second surfaces of the conductive interconnection structures comprises a sloped sidewall.

14. The method according to claim 10, wherein the provided silicon carrier comprises a barrier metal directly on the conductive interconnection structures.

15. The method according to claim 10, wherein the provided silicon carrier comprises a barrier metal on the conductive interconnection structures and on a first surface of the silicon carrier, the method further comprising removing at least a portion of the barrier metal.

16. The method according to claim 10, wherein the conductive interconnection structures within the wells of the provided silicon carrier directly contact silicon of the provided silicon carrier.

17. The method according to claim 10, comprising thinning the encapsulating material to expose the semiconductor die.

18. The method according to claim 10, wherein the conductive interconnection structures comprise metal pads.

* * * * *